United States Patent [19]
Koh et al.

[11] Patent Number: 5,597,764
[45] Date of Patent: Jan. 28, 1997

[54] METHOD OF CONTACT FORMATION AND PLANARIZATION FOR SEMICONDUCTOR PROCESSES

[75] Inventors: Chao-Ming Koh, Hsinchu; Yeh-Sen Lin, Tao-Yuan; Rong-Wu Chien, Chyai, all of Taiwan

[73] Assignee: Vanguard International Semiconductor Corporation, Hsin-Chu, Taiwan

[21] Appl. No.: 679,859

[22] Filed: Jul. 15, 1996

[51] Int. Cl.$^6$ .................................................. H01L 21/44
[52] U.S. Cl. .......................... 437/195; 437/189; 437/228; 437/235
[58] Field of Search .................... 437/195, 228, 437/238, 235, 189

[56] References Cited

U.S. PATENT DOCUMENTS

| | | | |
|---|---|---|---|
| 4,775,550 | 10/1988 | Chu et al. | 437/235 |
| 4,906,592 | 3/1990 | Merenda et al. | 437/189 |
| 4,966,867 | 10/1990 | Crotti et al. | 437/235 |
| 5,110,763 | 5/1992 | Matsumoto | 437/195 |
| 5,219,792 | 6/1993 | Kim et al. | 437/195 |
| 5,266,525 | 11/1993 | Morozumi | 437/195 |
| 5,302,551 | 4/1994 | Iranmanesh et al. | 437/228 |
| 5,397,743 | 3/1995 | Jun et al. | 437/195 |
| 5,459,105 | 10/1995 | Matsuura | 437/238 |
| 5,470,793 | 11/1995 | Kalnitsky | 437/195 |
| 5,532,188 | 7/1996 | Wright | 437/189 |

*Primary Examiner*—Kevin Picardat
*Attorney, Agent, or Firm*—George O. Saile; Rosemary L. S. Pike

[57] ABSTRACT

A new method for forming small contacts and for planarizing the dielectric layer in the fabrication of an integrated circuit device is described. Semiconductor device structures are formed in and on a semiconductor substrate. A dielectric layer is deposited overlying the semiconductor device structures. The dielectric layer is covered with a photoresist mask and partially etched into to form first openings of a first width wherein the first openings do not contact the underlying semiconductor device structures. An oxide layer is deposited over the dielectric layer and within the first openings whereby second openings are formed having a second width smaller than the first width. The oxide layer is etched away whereby the second openings are extended through the dielectric layer to the underlying semiconductor device structures to form small contact openings having the second width and whereby the dielectric layer is planarized. A conducting layer is deposited and patterned to complete the formation of the small contacts and planarized dielectric layer in the fabrication of an integrated circuit device.

25 Claims, 13 Drawing Sheets

METHOD OF CONTACT FORMATION AND PLANARIZATION FOR SEMICONDUCTOR PROCESSES

BACKGROUND OF THE INVENTION (1) Field of the Invention

The present invention relates to the fabrication of integrated circuit devices, and more particularly, to a method of small contact formation combined with etchback planarization in the fabrication of integrated circuits.

(2) Description of the Prior Art

In the fabrication of integrated circuits, a dielectric layer is deposited over a semiconductor substrate containing semiconductor device structures such as gate electrodes and source and drain regions. It is desirable to planarize the dielectric layer. Planarization can be a complex or expensive process. Contact openings are made through the dielectric layer to the underlying semiconductor device structures to be contacted. A conducting layer is deposited into the contact openings and patterned to complete the desired electrical connections. The process of making a small contact, on the order of 0.1 to 0.5 microns, is limited by lithography constraints or is a complex process.

U.S. Pat. No. 4,775,550 to Chu et al teaches a spin-on-glass and oxide etchback process.

SUMMARY OF THE INVENTION

Accordingly, it is a primary object of the invention to provide a process for simultaneously planarizing an interlevel dielectric layer and forming small contact openings in the fabrication of integrated circuits.

It is a further object of the invention to form small contact openings on the order of between about 0.1 to 0.5 microns.

In accordance with the objects of the invention, a new method for forming small contacts and for planarizing the dielectric layer in the fabrication of an integrated circuit device is achieved. Semiconductor device structures are formed in and on a semiconductor substrate. A dielectric layer is deposited overlying the semiconductor device structures. The dielectric layer is covered with a photoresist mask and partially etched into to form first openings of a first width wherein the first openings do not contact the underlying semiconductor device structures. An oxide layer is deposited over the dielectric layer and within the first openings whereby second openings are formed having a second width smaller than the first width. The oxide layer is etched away whereby the second openings are extended through the dielectric layer to the underlying semiconductor device structures to form small contact openings having the second width and whereby the dielectric layer is planarized. A conducting layer is deposited and patterned to complete the formation of the small contacts and planarized dielectric layer in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

The process of the present invention combines small contact formation with etchback planarization. A chemically vapor deposited (CVD) dielectric layer is provided on a partially etched contact in order to narrow the contact size. This is followed by a second etch with an etch stop on the underlying conductor layer which is to be contacted. The second etch is a non-masked etching so that it is also the planarized etchback step.

EXAMPLES

The following Examples are given to show the important features of the invention and to aid in the understanding thereof. Variations may be made by one skilled in the art without departing from the spirit and scope of the invention.

Example 1

Figure 1:
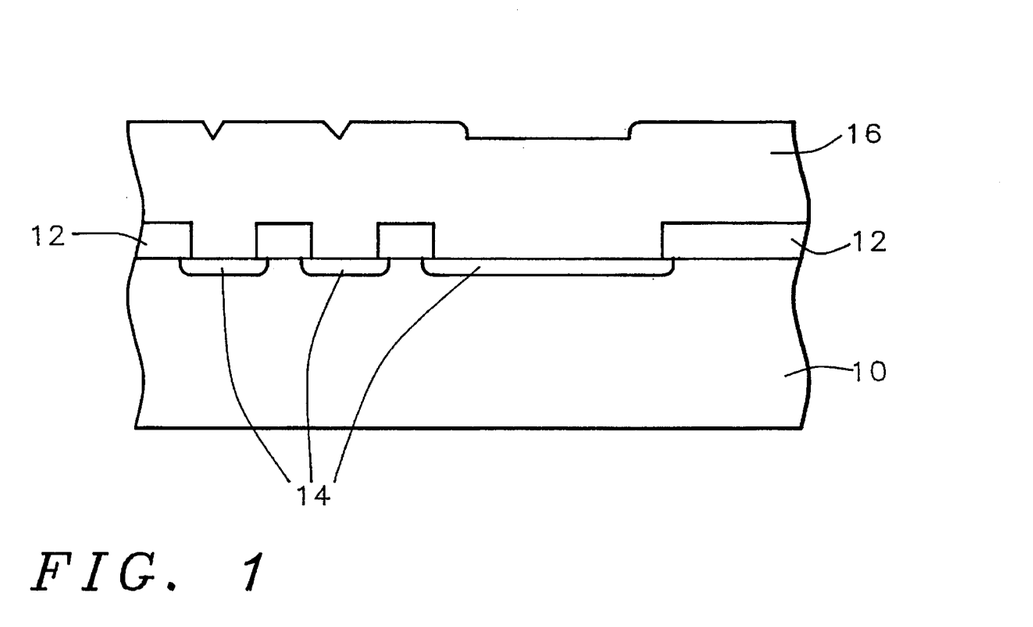
FIGS. 1 through 6 are cross-sectional representations of a first preferred embodiment of the present invention.

FIGS. 1 through 6 illustrate the use of the process of the invention on a locally planarized surface. Referring now more particularly to FIG. 1, there is shown a semiconductor substrate 10, in which may be formed semiconductor device structures which may include polysilicon gate electrodes and interconnection lines 12 and source and drain regions 14.

Figure 2:
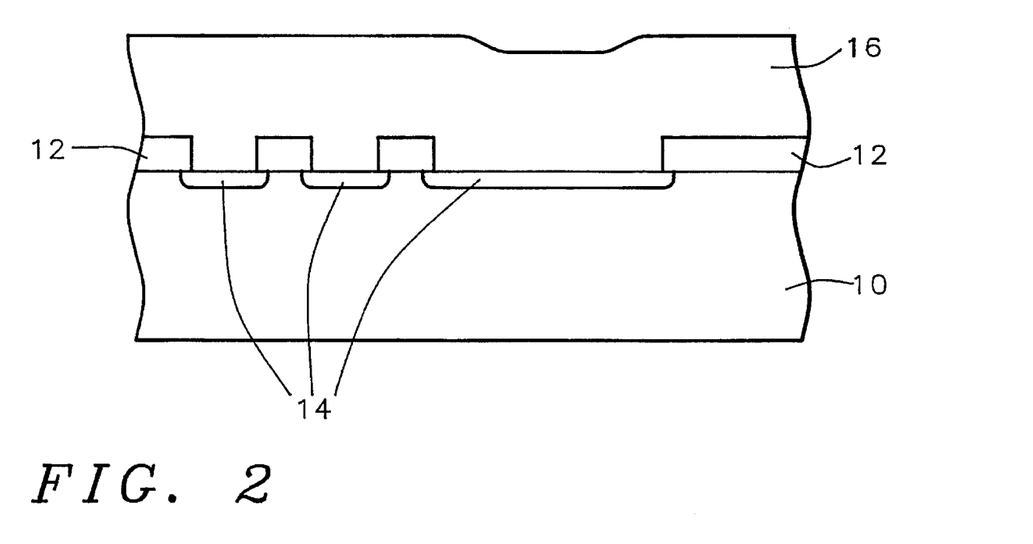

A thick dielectric layer 16 is deposited over the surface of the semiconductor device structures. The dielectric layer may be borophosphosilicate glass (BPSG), phosphosilicate glass (PSG), spin-on-glass, tetraethoxysilane (TEOS) oxide, silicon nitride, or the like, deposited to a thickness of between about 4000 to 15,000 Angstroms, depending on the process requirements. The thick dielectric layer is locally planarized by reflow (for BPSG or the like), or by deposition followed by etchback, or by chemical mechanical polishing (CMP), or other methods. The locally planarized layer 16 is illustrated in FIG. 2.

Figure 3:
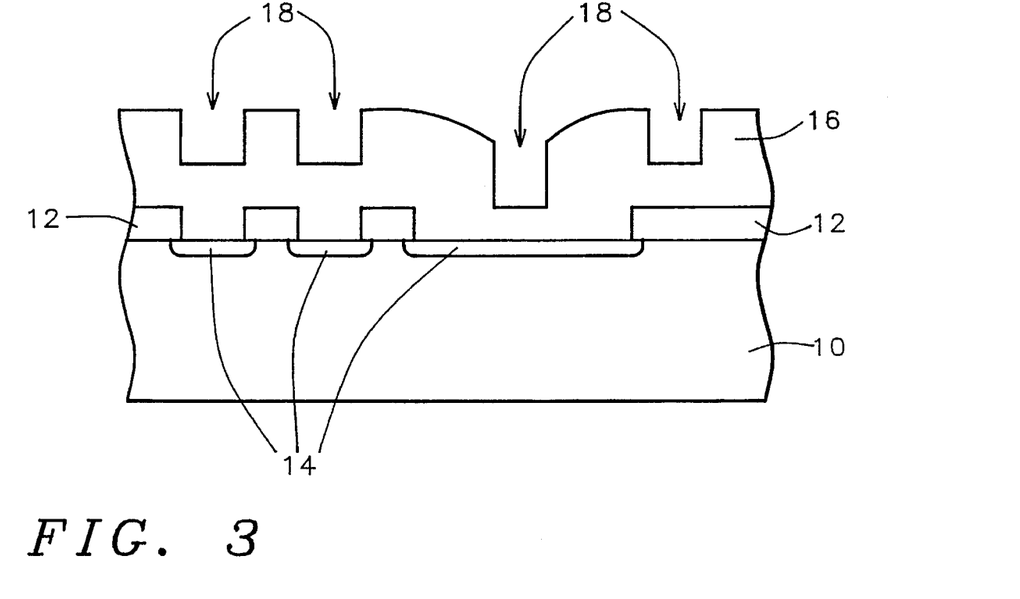

A layer of photoresist, not shown, is coated over the dielectric layer 16 and patterned to form a photomask with openings where contact openings are to be made. The thick dielectric layer 16 is partially etched to a certain depth. This depth will determine the thickness to be etched in the second etching and the thickness of the dielectric layer remaining above the device structures. This parameter must be adjusted according to design requirements. Partial contact openings 18 are illustrated in FIG. 3. The photomask is stripped.

Figure 4:
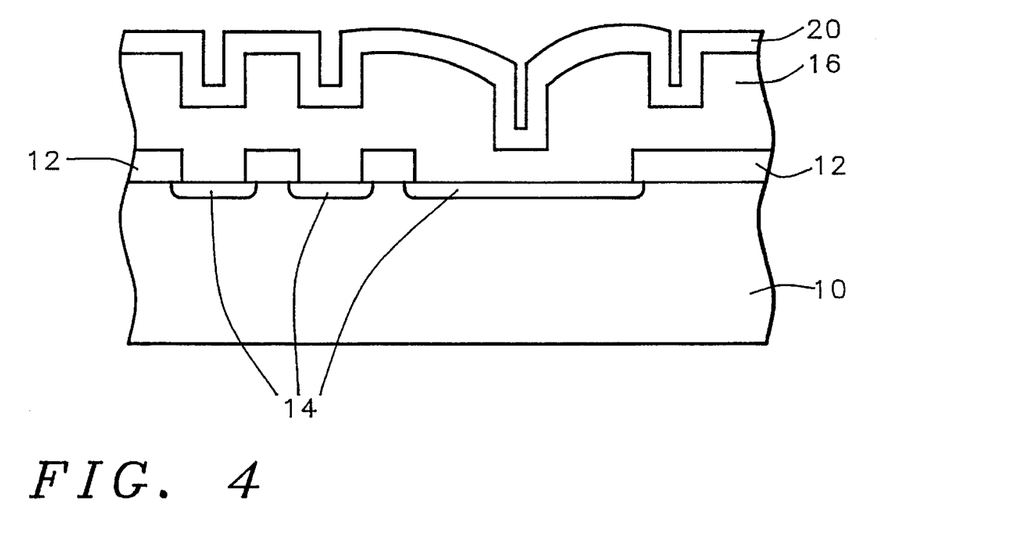

Next, referring to FIG. 4, a second dielectric layer 20 is deposited by chemical vapor deposition (CVD) over the surface of the thick dielectric layer 16 and within the contact openings 18. This may be a conformal deposition. The second dielectric layer material may be silicon oxide or silicon nitride, or the like. The second dielectric layer 20 within the contact openings narrows them. The second dielectric layer is deposited to a thickness of between about 500 to 2000 Angstroms.

Figure 5:
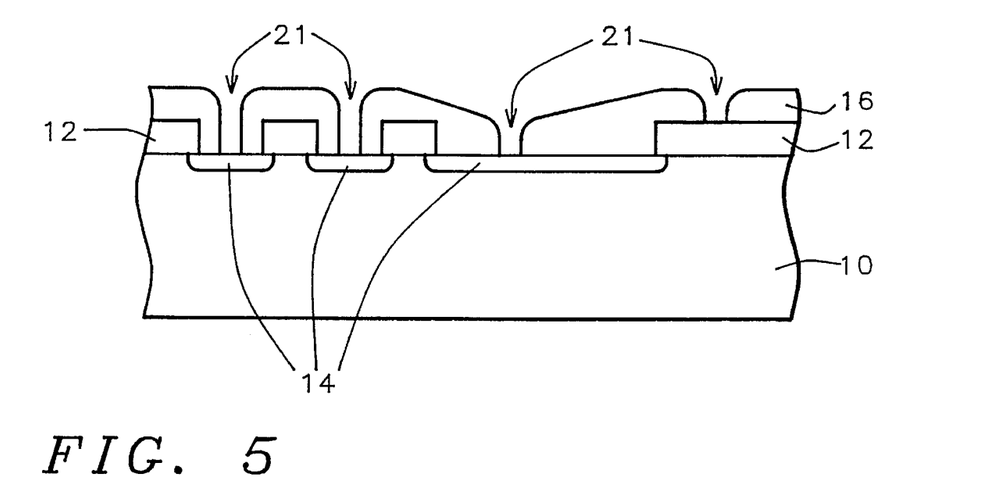

Referring now to FIG. 5, a blanket etch etches away the second dielectric layer 20 and etches the first dielectric layer 16 with an etch stop at the conductor layer where the contact is to be made, such as at the source and drain regions 14 and interconnection line 12, as shown. The resulting contact openings 21 are much narrower than the original contact openings 18. For example, the first contact openings 18 may be on the order of 0.4 to 0.7 microns in width and the second contact openings 21 may have a width of between about 0.1 to 0.5 microns.

Figure 6:
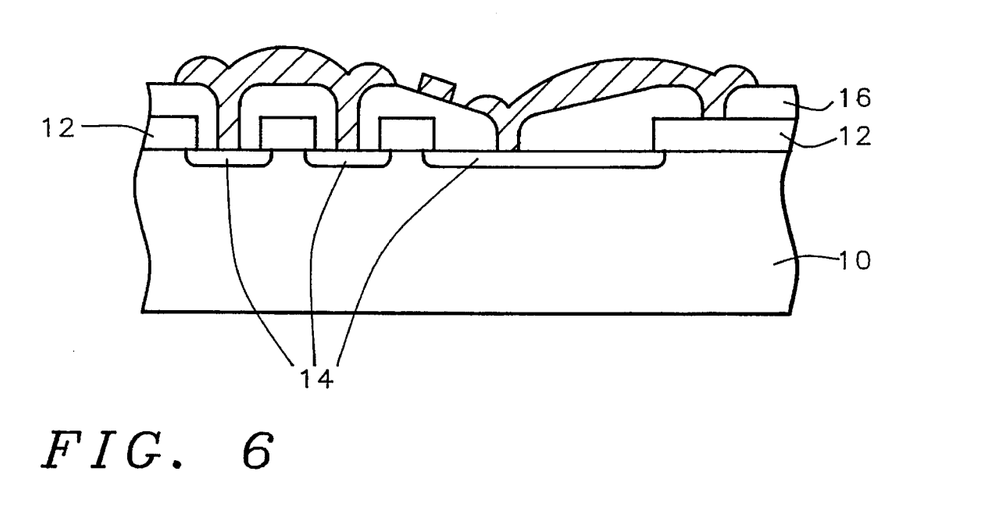

Referring to FIG. 6, a conducting layer 24 is deposited and patterned to complete the electrical connections in the fabrication of the desired integrated circuit device.

Example 2

Figure 7:
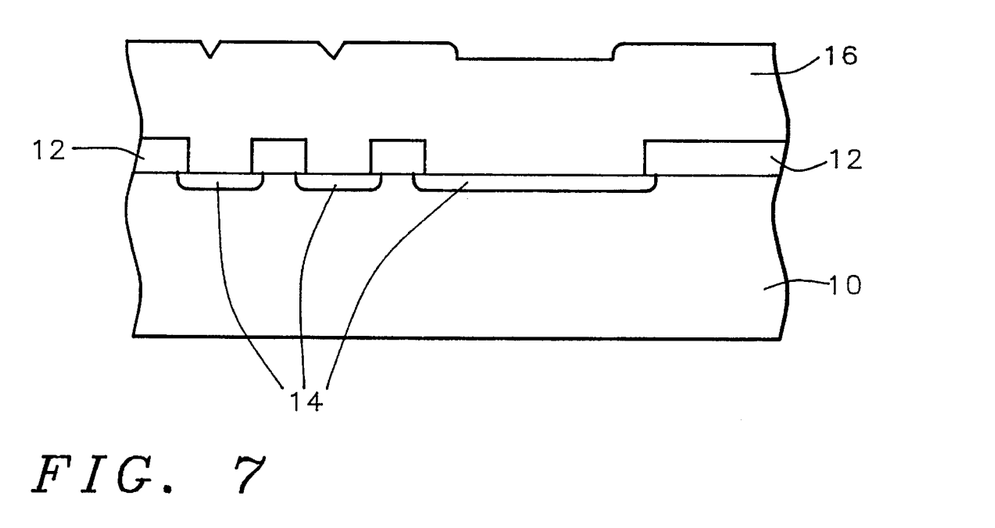
FIGS. 7 through 12 are cross-sectional representations of a second preferred embodiment of the present invention.

FIGS. 7 through 12 illustrate the use of the process of the invention on a spin-on-glass (SOG) planarized surface in which the SOG layer is completely etched away. Referring now more particularly to FIG. 7, there is shown a semiconductor substrate 10, in which may be formed semiconductor device structures which may include polysilicon gate electrodes and interconnection lines 12 and source and drain regions 14.

A thick dielectric layer 16 is deposited over the surface of the semiconductor device structures. The dielectric layer may be CVD silicon oxide, BPSG, spin-on-glass, silicon nitride, or the like. It is preferred that the dielectric material have an etch rate close to the etch rate of spin-on-glass. The dielectric layer material 16 is deposited to a thickness of between about 2000 to 6000 Angstroms.

Figure 8:
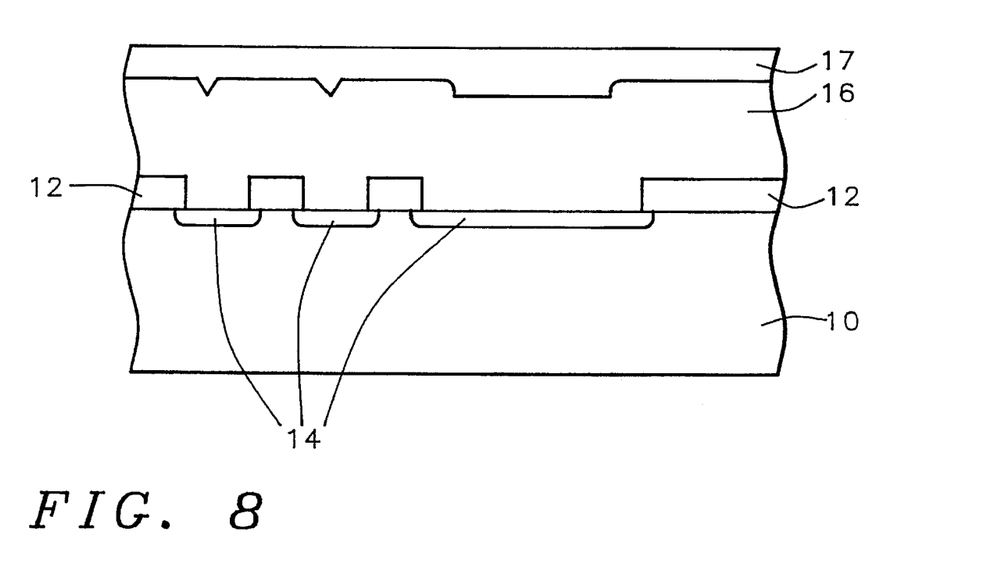

A spin-on-glass (SOG) material 17 is coated over the thick dielectric layer 16. The spin-on-glass material suspended in a vehicle or solvent is deposited onto the wafer surface and uniformly spread thereover by the action of spinning the wafer. The SOG material fills the indentations in the wafer surface. Most of the vehicle or solvent is driven off by a low temperature baking step and then the layer is cured, as is conventional. The spin-on-glass layer 17 is illustrated in FIG. 8.

Figure 9:
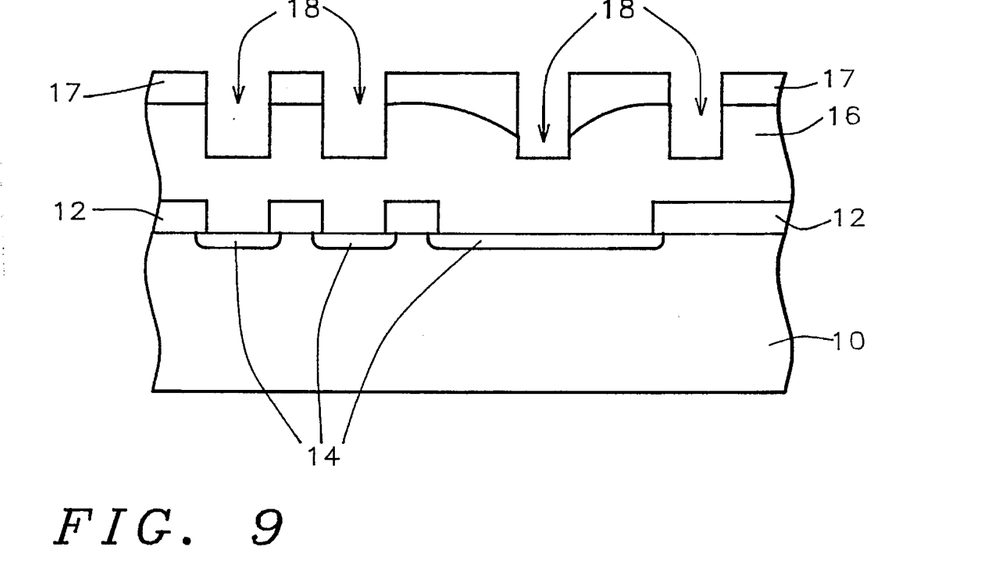

A layer of photoresist, not shown, is coated over the SOG layer 17 and patterned to form a photomask with openings where contact openings are to be made. The SOG and thick dielectric layers 17 and 16 are partially etched to a certain depth. As discussed hereinabove in the first Example, the certain depth must be determined according to design requirements. The etching rates of the SOG and the dielectric material are essentially the same. Partial contact openings 18 are illustrated in FIG. 9. The photomask is stripped.

Figure 10:
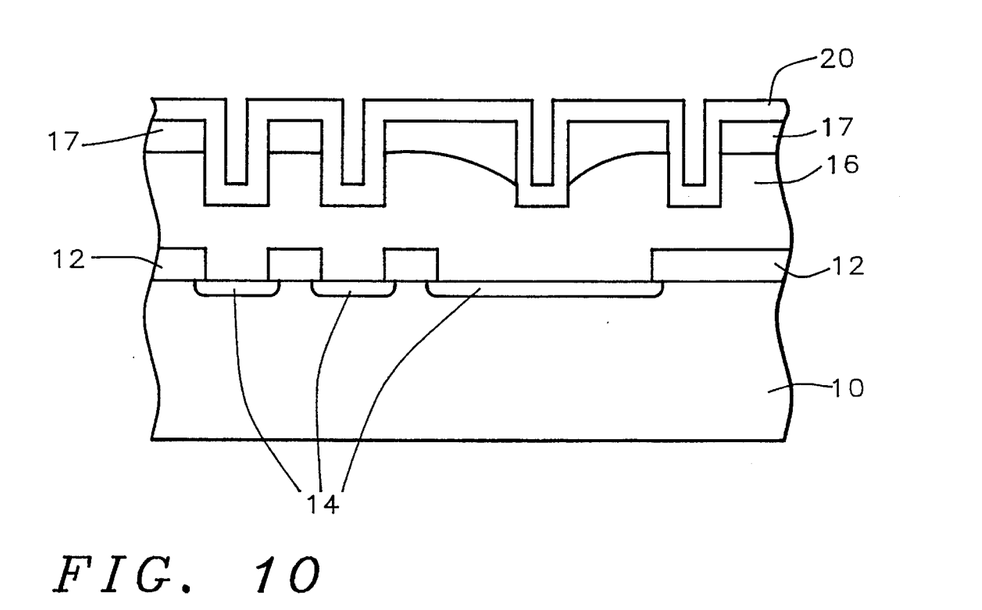

Next, referring to FIG. 10, a layer of oxide 20 is conformally deposited by chemical vapor deposition (CVD) over the surface of the SOG layer 17 and within the contact openings 18 to a thickness of between about 500 to 2000 Angstroms. The oxide layer 20 within the contact openings narrows them.

Figure 11:
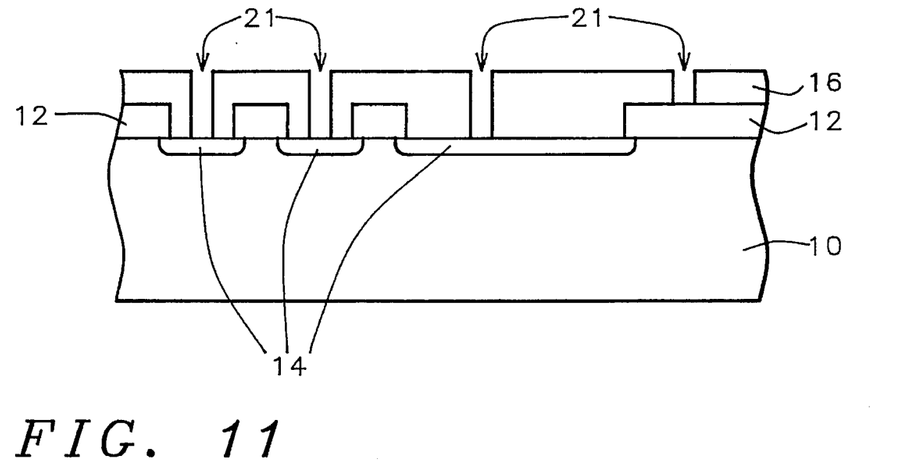

Referring now to FIG. 11, a blanket oxide etch etches away the oxide layer 20 and the SOG layer 17 and etches the dielectric layer 16 with an etch stop at the conductor layer where the contact is to be made, such as at the source and drain regions 14 and interconnection line 12, as shown. The resulting contact openings 21 are much narrower than the original contact openings 18.

Figure 12:
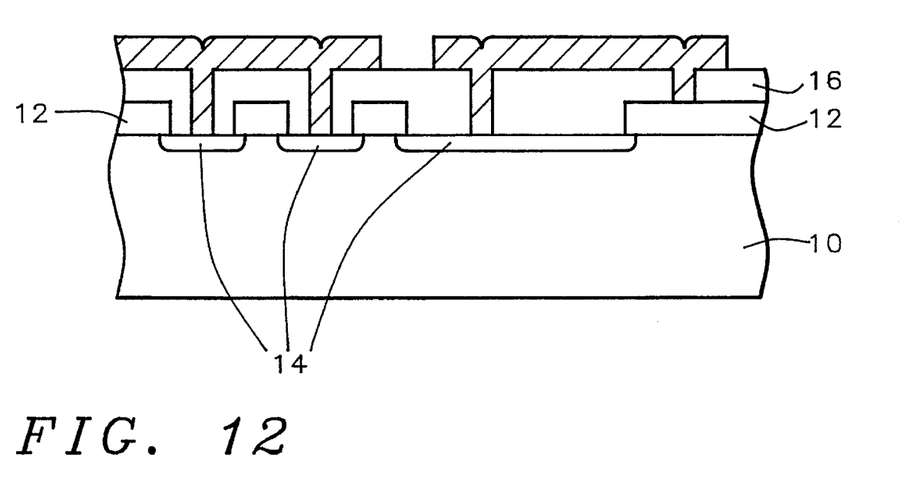

Referring to FIG. 12, a conducting layer 24 is deposited and patterned to complete the electrical connections in the fabrication of the desired integrated circuit device.

Example 3

Figure 13:
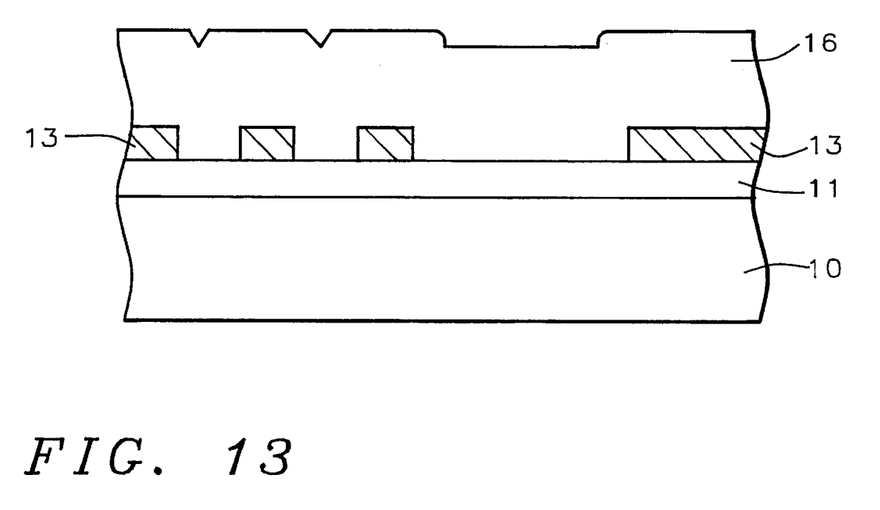
FIGS. 13 through 23 are cross-sectional representations of a third preferred embodiment of the present invention.

FIGS. 13 through 23 illustrate the use of the process of the invention on multi-layer conductors. Referring now more particularly to FIG. 13, there is shown a semiconductor substrate 10, in which may be formed semiconductor device structures which may include polysilicon gate electrodes and interconnection lines and source and drain regions, not shown. These semiconductor device structures are covered by a first dielectric layer 11. A first conducting layer 13 is deposited over the dielectric layer 11 and patterned as shown in FIG. 13.

A thick dielectric layer 16 is deposited over the surface of the patterned conducting layer 13. The dielectric layer may be CVD silicon oxide, TEOS oxide, or silicon nitride deposited to a thickness of between about 4000 to 15,000 Angstroms.

Figure 14:
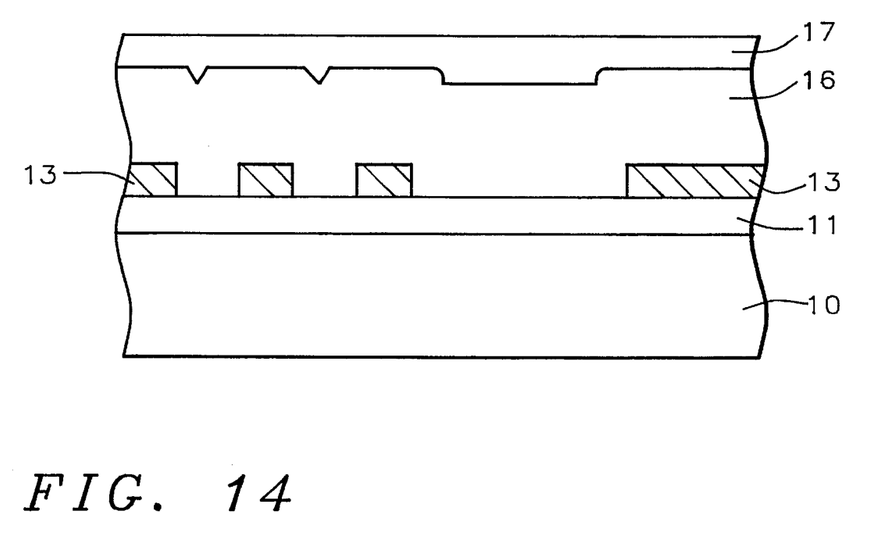

A spin-on-glass material 17 is coated over the thick dielectric layer 16. The spin-on-glass material suspended in a vehicle or solvent is deposited onto the wafer surface and uniformly spread thereover by the action of spinning the wafer. The SOG material fills the indentations in the wafer surface; that is planarization. Most of the vehicle or solvent is driven off by a low temperature baking step, and then the SOG layer is cured, as is conventional. The spin-on-glass layer 17 is illustrated in FIG. 14.

Figure 14A:
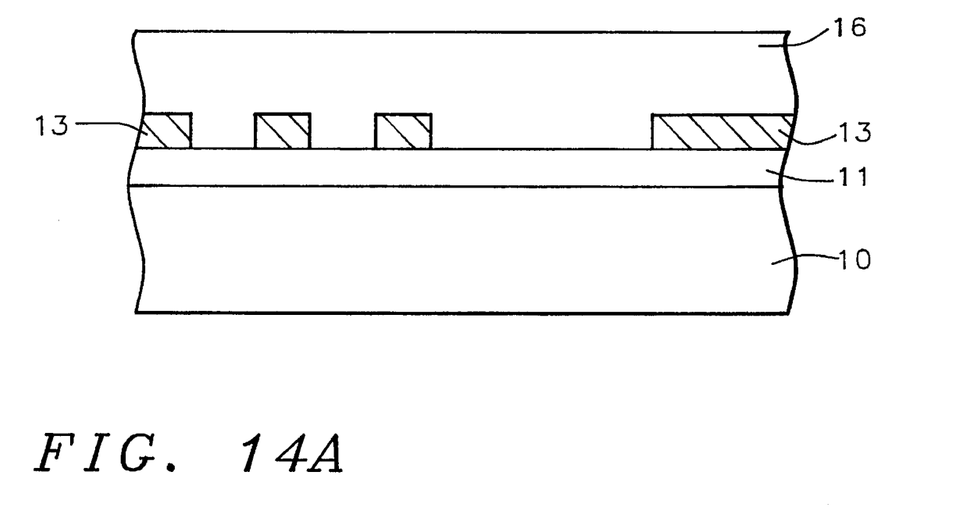

Alternatively, instead of using SOG for planarization, the dielectric layer 16 can be locally planarized by chemical mechanical polishing, as shown in FIG. 14A. Processing continues in the same way for this alternative. However, the SOG planarization is illustrated in the drawing figures.

Figure 15:
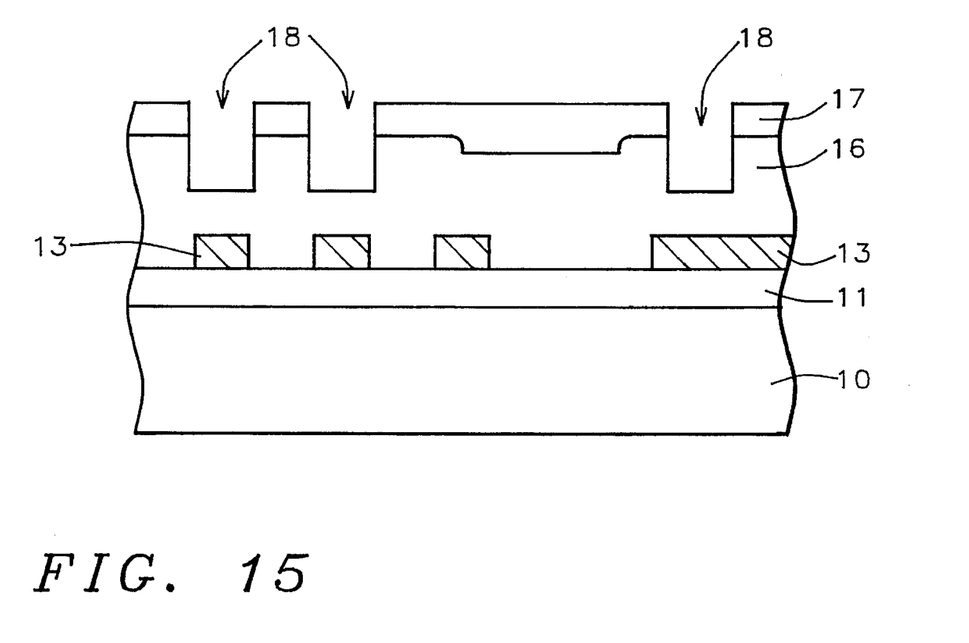

A layer of photoresist, not shown, is coated over the SOG layer 17 and patterned to form a photomask with openings where contact openings are to be made. The SOG and thick dielectric layers 17 and 16 are partially etched to a certain depth. The etching rates of the SOG and the dielectric material are essentially the same. Partial contact openings 18 are illustrated in FIG. 15. The photomask is stripped.

Figure 16:
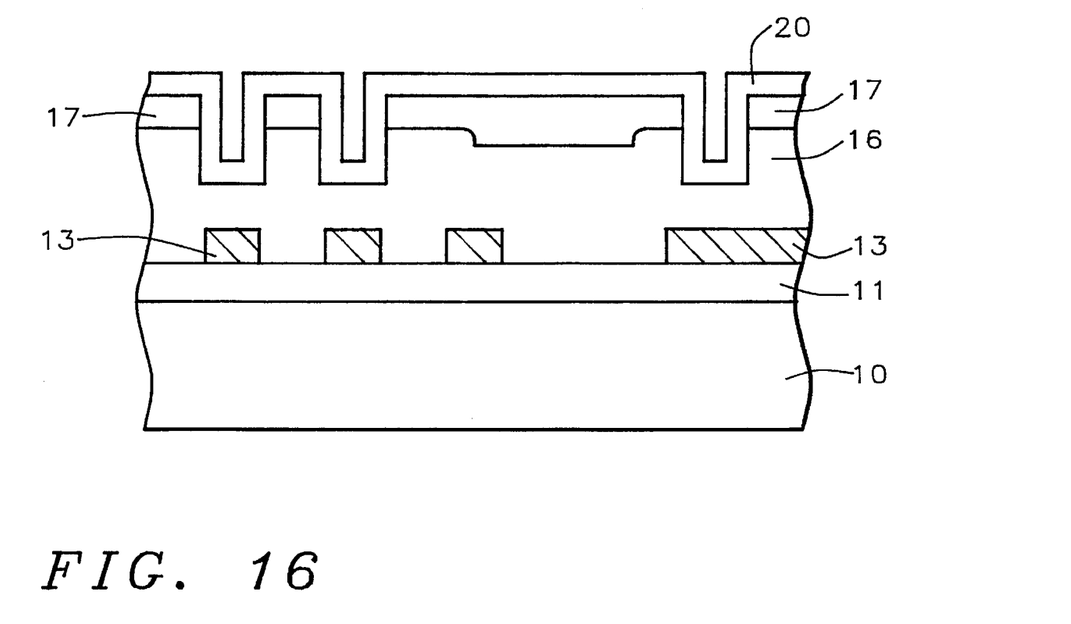

Next, referring to FIG. 16, a second dielectric layer comprising silicon oxide or silicon nitride 20 is deposited by chemical vapor deposition (CVD) over the surface of the SOG layer 17 and within the contact openings 18 to a thickness of between about 500 to 2000 Angstroms. This may be a conformal deposition. The second dielectric layer 20 within the contact openings narrows them.

Figure 17:
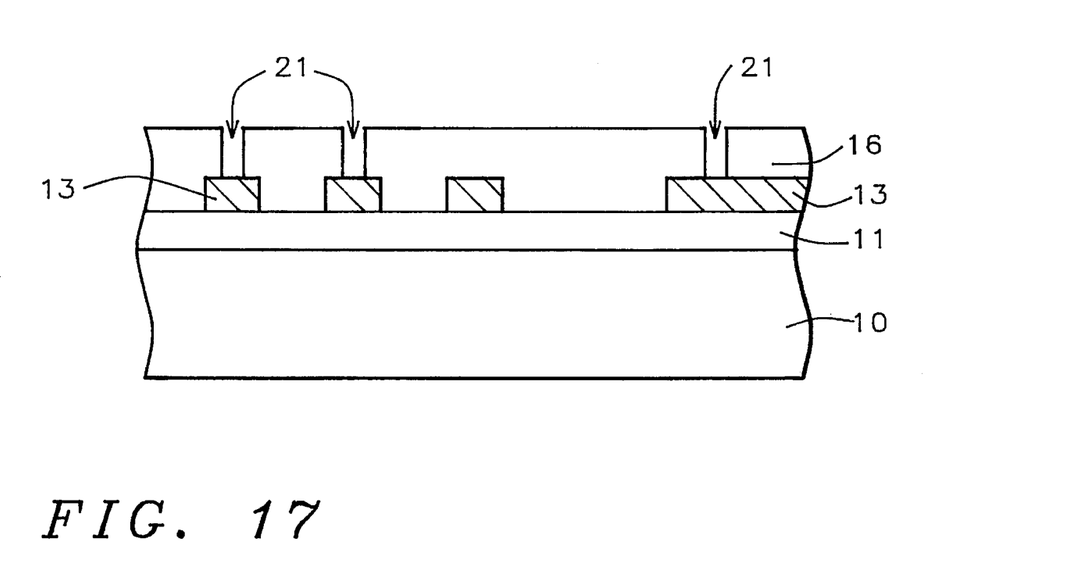

Referring now to FIG. 17, a blanket etch etches away the second dielectric layer 20 and the SOG layer 17 and etches the dielectric layer 16 with an etch stop at the conductor layer where the contact is to be made, such as at the conducting lines 13, as shown. The resulting contact openings 21 are much narrower than the original contact openings 18.

Figure 18:
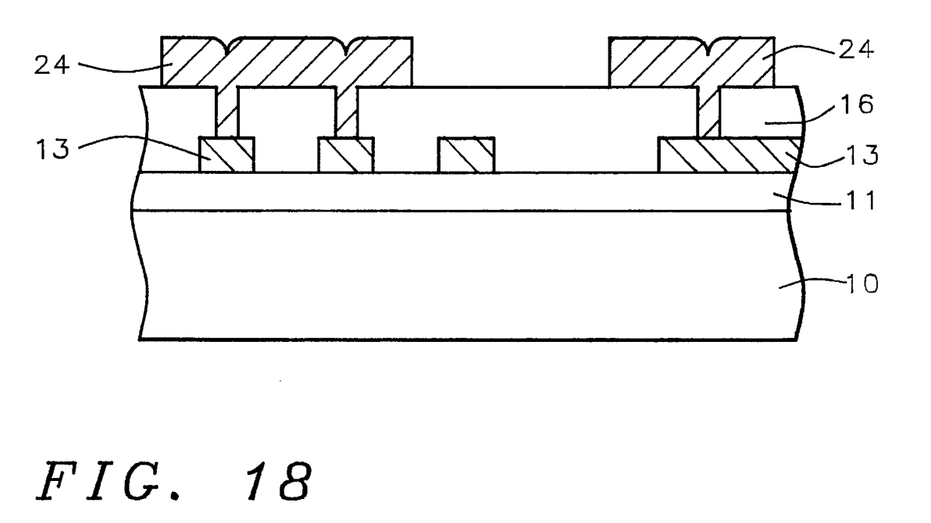

Referring to FIG. 18, a second conducting layer 24 is deposited and patterned to complete the electrical connections.

Figure 19:
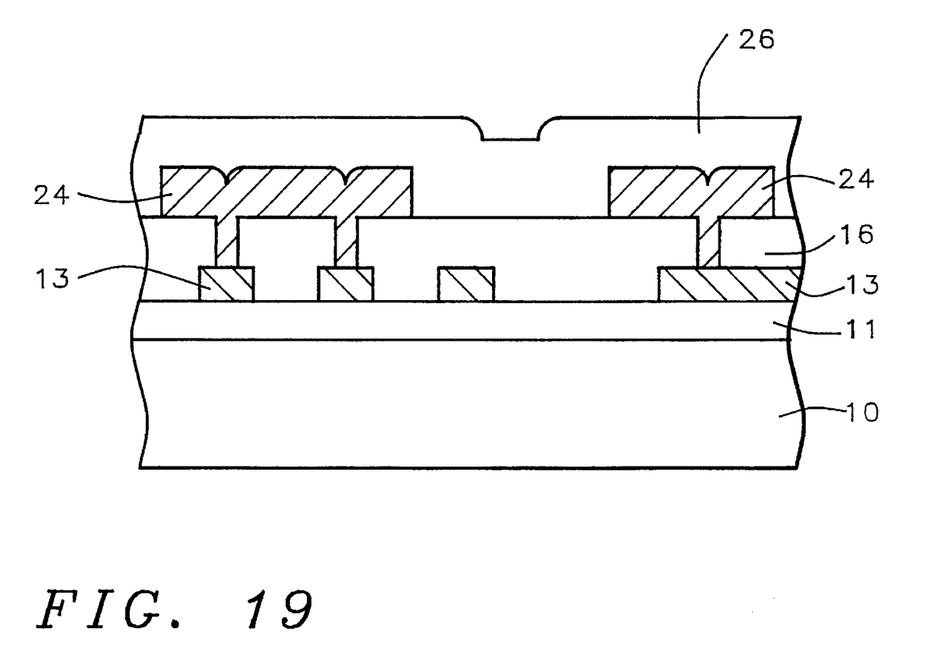

Referring now to FIG. 19, a thick dielectric layer 26 is deposited over the surface of the patterned conducting layer 24. The dielectric layer may be CVD silicon oxide or silicon nitride deposited to a thickness of between about 4000 to 14,800 Angstroms.

Figure 20:
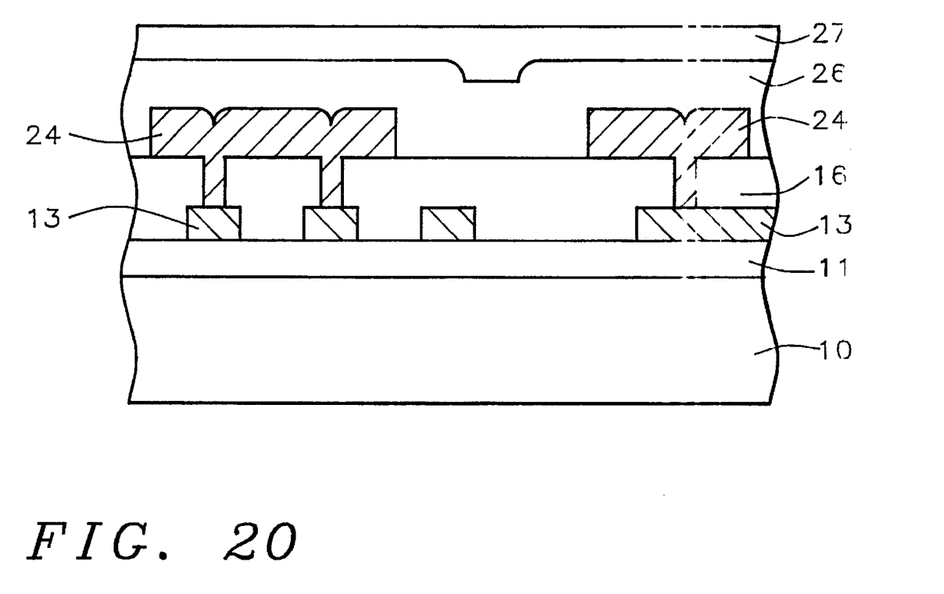

A spin-on-glass material 27 is coated over the thick dielectric layer 26. The spin-on-glass material suspended in a vehicle or solvent is deposited onto the wafer surface and uniformly spread thereover by the action of spinning the wafer. The SOG material fills the indentations in the wafer surface; that is planarization. Most of the vehicle or solvent is driven off by a low temperature baking step, and then the SOG layer is cured. The spin-on-glass layer 27 is illustrated in FIG. 20.

Figure 20A:
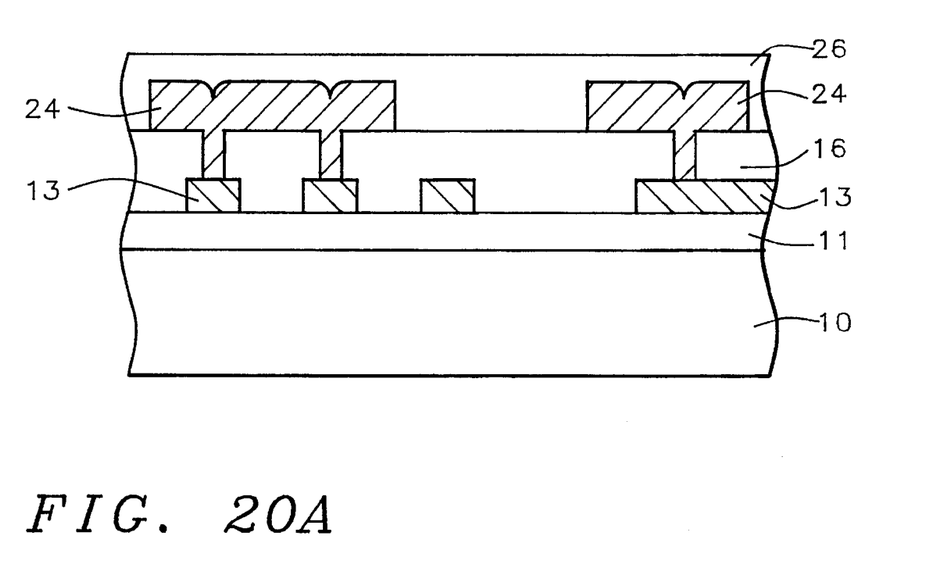

Alternatively, as above, the dielectric layer 26 may be locally planarized by CMP, as illustrated in FIG. 20A. Processing continues in the same way for this alternative. However, the SOG planarization is illustrated in the drawing figures.

Figure 21:
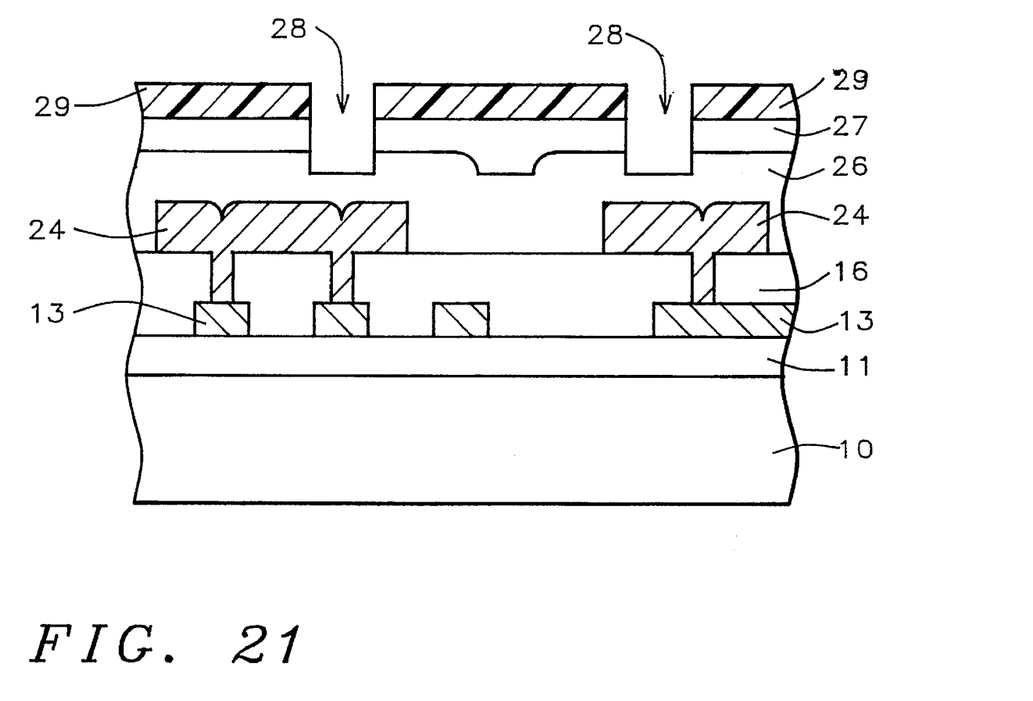

A layer of photoresist 29 is coated over the SOG layer 27 and patterned to form a photomask with openings where contact openings are to be made. The SOG and thick dielectric layers 27 and 26 are partially etched to a certain depth. The etching rates of the SOG and the dielectric material are essentially the same. Partial contact openings 28 are illustrated in FIG. 21. The photomask is stripped.

Figure 22:
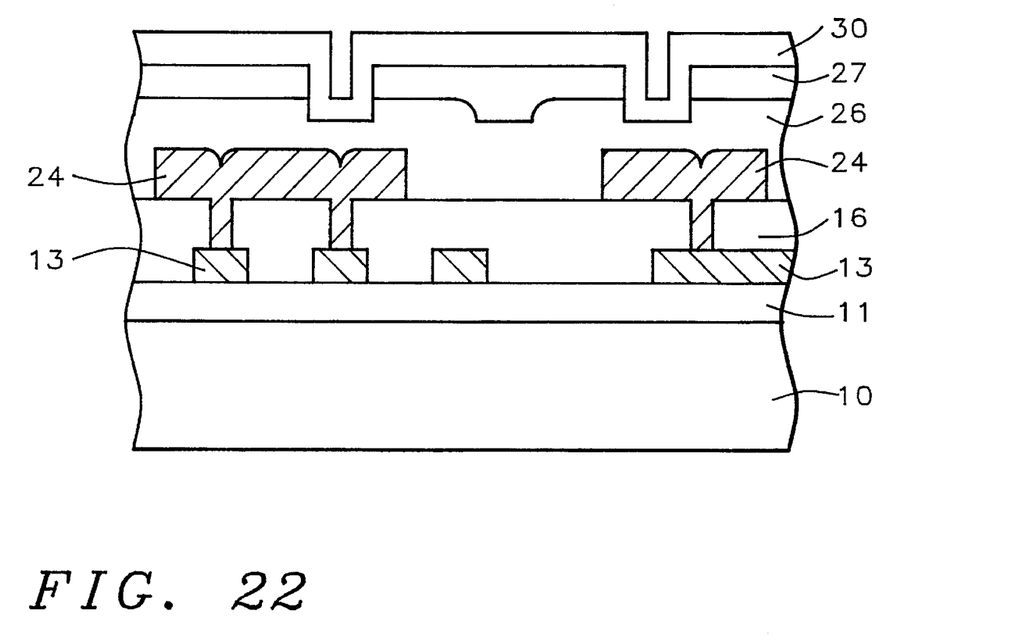

Next, referring to FIG. 22, a fourth dielectric layer of silicon oxide or silicon nitride 30 is conformally deposited by chemical vapor deposition (CVD) over the surface of the SOG layer 27 and within the contact openings 28 to a thickness of between about 500 to 2000 Angstroms. The oxide layer 30 within the contact openings narrows them.

Figure 23:
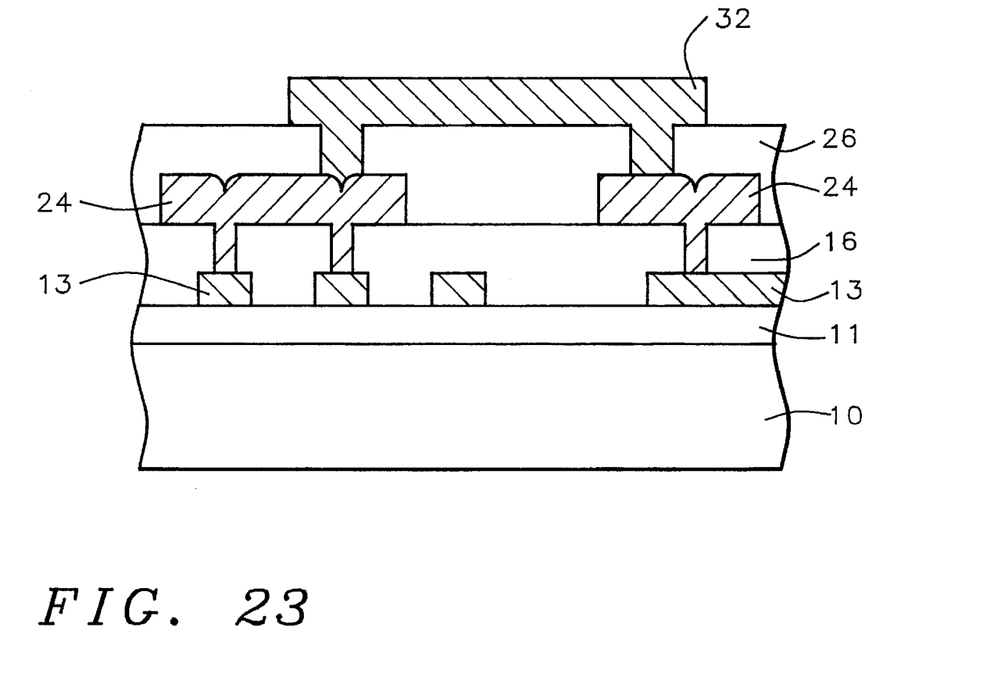

Referring now to FIG. 23, a blanket etch etches away the fourth dielectric layer 30 and the SOG layer 27 and etches the dielectric layer 26 with an etch stop at the conductor layer where the contact is to be made, such as at the conducting lines 24, as shown. The resulting contact openings are much narrower than the original contact openings 28. A second conducting layer 32 is deposited and patterned to complete the electrical connections in the fabrication of the desired integrated circuit device.

The process of the invention provides a method for simultaneously providing a planarized interlevel dielectric layer and small contacts.

While the invention has been particularly shown and described with reference to the preferred embodiments thereof, it will be understood by those skilled in the art that various changes in form and details may be made without departing from the spirit and scope of the invention.

What is claimed is:

1. A method for forming small contacts and for planarizing the dielectric layer in the fabrication of an integrated circuit device comprising:

forming semiconductor device structures in and on a semiconductor substrate;

depositing a first dielectric layer overlying said semiconductor device structures;

covering said first dielectric layer with a photoresist mask and partially etching into said first dielectric layer to form first openings of a first width wherein said first openings do not contact said underlying semiconductor device structures;

depositing a second dielectric layer over said first dielectric layer and within said first openings whereby second openings are formed having a second width smaller than said first width;

etching away said second dielectric layer whereby said second openings are extended downward through said first dielectric layer to said underlying semiconductor device structures to form small contact openings having said second width and whereby said first dielectric layer is planarized; and depositing and patterning a conducting layer to complete the formation of said small contacts and said planarized dielectric layer in the fabrication of said integrated circuit device.

2. The method according to claim 1 wherein said semiconductor device structures include polysilicon gate electrodes and interconnection lines and associated source and drain regions.

3. The method according to claim 1 wherein said semiconductor device structures include polysilicon gate electrodes and interconnection lines and associated source and drain regions, an overlying insulating layer, and overlying conducting lines.

4. The method according to claim 1 wherein said first dielectric layer comprises one of the group containing borophosphosilicate glass and phosphosilicate glass and has a thickness of between about 4000 to 15,000 Angstroms.

5. The method according to claim 4 wherein said first dielectric layer is locally planarized by reflow after it is deposited.

6. The method according to claim 1 wherein said first dielectric layer comprises one of the group containing borophosphosilicate glass, phosphosilicate glass, spin-on-glass, tetraethoxysilane oxide, and silicon nitride and has a thickness of between about 4000 to 15,000 Angstroms.

7. The method according to claim 6 wherein said first dielectric layer is locally planarized by etchback after it is deposited.

8. The method according to claim 6 wherein said first dielectric layer is locally planarized by chemical mechanical polishing after it is deposited.

9. The method according to claim 1 wherein said first dielectric layer comprises:

a first layer comprising one of the group containing silicon oxide and silicon nitride and having a thickness of between about 4000 to 15,000 Angstroms; and a second layer of spin-on-glass having a thickness of between about 2000 to 6000 Angstroms.

10. The method according to claim 1 wherein said second dielectric layer comprises on the of group containing silicon oxide and silicon nitride and is deposited by chemical vapor deposition to a thickness of between about 500 to 2000 Angstroms.

11. The method according to claim 1 wherein said small contacts have a width of between about 0.1 to 0.5 microns.

12. A method for forming small contacts and for planarizing the dielectric layer in the fabrication of an integrated circuit device comprising:

forming semiconductor device structures in and on a semiconductor substrate wherein said semiconductor device structures include polysilicon gate electrodes and interconnection lines and associated source and drain regions;

depositing a first dielectric layer overlying said semiconductor device structures;

locally planarizing said first dielectric layer;

covering said first dielectric layer with a photoresist mask and partially etching into said first dielectric layer to form first openings of a first width wherein said first openings do not contact said underlying semiconductor device structures;

depositing a second dielectric layer over said first dielectric layer and within said first openings whereby second openings are formed having a second width smaller than said first width;

etching away said second dielectric layer whereby said second openings are extended downward through said first dielectric layer to said underlying semiconductor device structures to form small contact openings having said second width and whereby said first dielectric layer is planarized; and depositing and patterning a conducting layer to complete the formation of said small contacts and said planarized dielectric layer in the fabrication of said integrated circuit device.

13. The method according to claim 12 wherein said first dielectric layer comprises one of the group containing borophosphosilicate glass and phosphosilicate glass and has a thickness of between about 4000 to 15,000 Angstroms and wherein said first dielectric layer is locally planarized by reflow.

14. The method according to claim 12 wherein said first dielectric layer comprises one of the group containing borophosphosilicate glass, phosphosilicate glass and spin-on-glass and has a thickness of between about 4000 to 15,000 Angstroms and wherein said first dielectric layer is locally planarized by etchback.

15. The method according to claim 12 wherein said first dielectric layer comprises one of the group containing borophosphosilicate glass, phosphosilicate glass, spin-on-glass, tetraethoxysilane oxide, and silicon nitride and has a thickness of between about 4000 to 15,000 Angstroms and wherein said first dielectric layer is locally planarized by chemical mechanical polishing.

16. The method according to claim 12 wherein said first dielectric layer comprises one of the group containing silicon oxide and silicon nitride and has a thickness of between about 4000 to 15,000 Angstroms and wherein said dielectric layer is locally planarized by coating said dielectric layer with a layer of spin-on-glass having a thickness of between about 2000 to 6000 Angstroms.

17. The method according to claim 12 wherein said second dielectric layer comprises one of the group containing silicon oxide and silicon nitride and is deposited by chemical vapor deposition to a thickness of between about 500 to 2000 Angstroms.

18. The method according to claim 12 wherein said small contacts have a width of between about 0.1 to 0.5 microns.

19. A method for forming small contacts and for planarizing the dielectric layer in the fabrication of an integrated circuit device comprising:

forming semiconductor device structures in and on a semiconductor substrate wherein said semiconductor device structures include polysilicon gate electrodes and interconnection lines and associated source and drain regions;

covering said semiconductor device structures with an insulating layer;

depositing a conducting layer overlying said insulating layer and patterning said conducting layer to form conducting lines;

depositing a first dielectric layer overlying said conducting lines;

locally planarizing said first dielectric layer;

covering said first dielectric layer with a photoresist mask and partially etching into said first dielectric layer to form first openings of a first width wherein said first openings do not contact said underlying conducting lines;

depositing a second dielectric layer over said first dielectric layer and within said first openings whereby second openings are formed having a second width smaller than said first width;

etching away said second dielectric layer whereby said second openings are extended downward through said first dielectric layer to said underlying conducting lines to form small contact openings having said second width and whereby said first dielectric layer is planarized; and depositing and patterning a second conducting layer to complete the formation of said small contacts and said planarized dielectric layer in the fabrication of said integrated circuit device.

20. The method according to claim 19 wherein said first dielectric layer comprises one of the group containing borophosphosilicate glass and phosphosilicate glass and has a thickness of between about 4000 to 15,000 Angstroms and wherein said first dielectric layer is locally planarized by reflow.

21. The method according to claim 19 wherein said dielectric layer comprises one of the group containing borophosphosilicate glass, phosphosilicate glass, and spin-on-glass and has a thickness of between about 4000 to 15,000 Angstroms and wherein said first dielectric layer is locally planarized by etchback.

22. The method according to claim 19 wherein said dielectric layer comprises one of the group containing borophosphosilicate glass, phosphosilicate glass, spin-on-glass, tetraethoxysilane oxide, and silicon nitride and has a thickness of between about 4000 to 15,000 Angstroms and wherein said first dielectric layer is locally planarized by chemical mechanical polishing.

23. The method according to claim 19 wherein said dielectric layer comprises one of the group containing borophosphosilicate glass, phosphosilicate glass, tetraethoxysilane oxide, and silicon nitride and has a thickness of between about 4000 to 15,000 Angstroms and wherein said first dielectric layer is locally planarized by coating said first dielectric layer with a layer of spin-on-glass having a thickness of between about 2000 to 6000 Angstroms.

24. The method according to claim 19 wherein said second dielectric layer comprises one of the group containing silicon oxide and silicon nitride and is deposited by chemical vapor deposition to a thickness of between about 500 to 2000 Angstroms.

25. The method according to claim 19 wherein said small contacts have a width of between about 0.1 to 0.5 microns.

* * * * *